(12) United States Patent
Wang et al.

(10) Patent No.: US 6,589,408 B1
(45) Date of Patent: Jul. 8, 2003

(54) NON-PLANAR COPPER ALLOY TARGET FOR PLASMA VAPOR DEPOSITION SYSTEMS

(75) Inventors: Pin-Chin Connie Wang, Menlo Park, CA (US); Paul R. Besser, Sunnyvale, CA (US); Sergey D. Lopatin, Santa Clara, CA (US); Minh Q. Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/107,778

(22) Filed: Mar. 27, 2002

(51) Int. Cl.[7] ............................................... C23C 14/35
(52) U.S. Cl. ........................... 204/298.13; 204/298.12; 204/298.18
(58) Field of Search ..................... 204/298.12, 298.13, 204/298.18

(56) References Cited

U.S. PATENT DOCUMENTS 4,622,121 A * 11/1986 Wegmann et al. ...... 204/298.18

\* cited by examiner

*Primary Examiner*—Rodney G. McDonald
(74) *Attorney, Agent, or Firm*—Foley & Lardner

(57) ABSTRACT

A non-planar target can be configured for use in a plasma vapor deposition (PVD) process in which ions bombard the non-planar target and cause alloy atoms present in the non-planar target to be knocked loose and form an alloy film layer. The target includes a top planar section having a first alloy concentration and a side annular section having a second alloy concentration. The side annular section has ends coupled to ends of the top planar section. The first alloy concentration and the second alloy concentration are different.

20 Claims, 1 Drawing Sheet

NON-PLANAR COPPER ALLOY TARGET FOR PLASMA VAPOR DEPOSITION SYSTEMS

FIELD OF THE INVENTION

The present invention relates generally to integrated circuits and methods of manufacturing integrated circuits. More particularly, the present invention relates to non-planar copper alloy targets for plasma vapor deposition (PVD) systems.

BACKGROUND OF THE INVENTION

Semiconductor devices or integrated circuits can include millions of devices, such as, transistors. Ultra-large scale integrated (ULSI) circuits can include complementary metal oxide semiconductor (CMOS) field effect transistors (FET). Despite the ability of conventional systems and processes to fabricate millions of integrated circuit devices on an integrated circuit, there is still a need to decrease the size of integrated circuit device features, and, thus, increase the number of devices on an integrated circuit. Nevertheless, there are many factors that make the continued miniaturization of integrated circuits difficult.

One process used in the fabrication of integrated circuits is sputtering. Sputtering is a process used to deposit materials where a plasma is used to generate ions. The ions are attracted to a target, the ions impact the target and physically knock loose target atoms, and the atoms knocked loose condense out on wafers placed in the chamber depositing a film. Typically, sputtering is used to deposit metal films. Sputtering is preferred over evaporation because sputtering transfers a metal alloy from a target to a wafer with roughly the same composition on the wafer as in the target. Evaporation deposits elements at different rates depending on vapor pressure so the film on the wafer may not match the composition of the target.

A target—the metal source for a sputtering process—is commonly round-thick pieces of metal larger in diameter than the wafers on which the metal will be deposited. In general, targets are specially shaped to optimize deposition uniformity.

Advanced plasma vapor deposition (PVD) systems require non-planar target designs to be able to induce a high ionization ratio. The non-planar shaped target also serves as a collimator, which eliminates the high angle species from the target. High angle species can be responsible for overhangs in the trench. Thus, a non-planar target can improved the conformality of sputtered film. Nevertheless, such non-planar targets can be difficult to make in copper alloy form because the mechanical properties of the alloy may cause the target to crack during the target making process. For example, a brittle Cu-alloy pallet can crack during a rolling or casting step in target making. Also, the types of alloys that can be used are limited because non-planar targets can require materials with greater workability. Further, during the deposition process, there may be particles or erosion uniformity issues that arise because of the properties of the copper alloy. Such non-uniform erosion of the target can cause alloy concentration variation within wafers.

Thus, there is a need for an improved non-planar copper alloy target for use with plasma vapor deposition systems. Further, there is a need for a non-planar copper alloy target with improved uniform doping during the deposition process. Even further, there is a need to make a non-planar copper alloy target by forming several pieces of the target separately and fusing the pieces together.

SUMMARY OF THE INVENTION

An exemplary embodiment is related to a non-planar target configured for use in a plasma vapor deposition (PVD) process in which ions bombard the non-planar target and cause alloy atoms present in the non-planar target to be knocked loose and form an alloy film layer. The target includes a top planar section having a first alloy concentration and a side annular section having a second alloy concentration. The side annular section has an end coupled to ends of the top planar section. The first alloy concentration may not be equal to the second alloy concentration.

Another exemplary embodiment is related to a non-planar target for ion bombardment during plasma vapor deposition. The target includes two top portions having first concentrations of copper alloy atoms and side portions extending from the ends of the two top portions. Two of the side portions are coupled together by a shared footing portion at ends distal to the ends coupled to the two top portions. The side portions have second concentrations of copper alloy atoms and the first concentrations are greater than the second concentrations.

Another exemplary embodiment is related to a non-planar copper alloy target including a dome-shaped target having a first concentration of copper alloy atoms at a relatively planar top section of the dome-shaped target and a second concentration of copper alloy atoms at an annular section of the dome-shaped target. The first concentration is greater than the second concentration.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
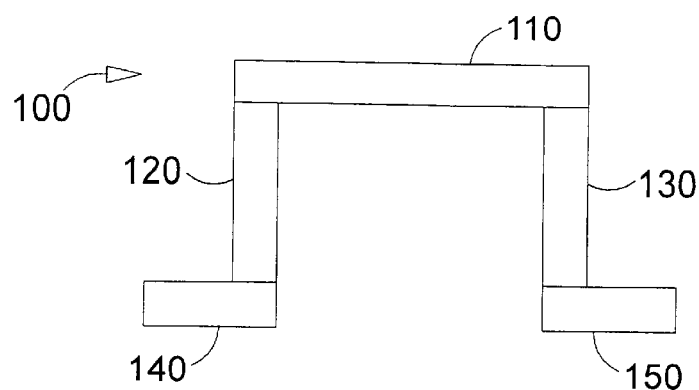
FIG. 1 is a schematic cross-sectional view representation of a non-planar target in accordance with an exemplary embodiment.

With reference to FIG. 1, a schematic cross-sectional view representation of a non-planar target 100 includes a top portion 110, side portions 120 and 130, and footings 140 and 150. Non-planar target 100 can be larger than the wafer size (e.g., approximately 12" for a 8" wafer although a specific size depends on the chamber and reactor design). The aspect ratio of the height of side portions 120 and 130 compared to the length of top portion 110 can be from ⅓ to 1.5. The typical thickness of target 100 can be about ⅛" to ¾". In an exemplary embodiment, there can be a backing plate for the target materials to provide the mechanical support.

During plasma vapor deposition (PVD), top portion 110 can erode slower than side portions 120 and 130. As such, a higher concentration of alloy can be used in top portion 110. In an exemplary embodiment, if top portion 110 has ½ the erosion rate to that of side portions 120 and 130, a 0.5 at % concentration can be used for top portion 110 and side portions 120 and 130 can have second alloy concentrations of, for example, 1.0 at %. Advantageously, selective concentration of alloy in non-planar target 100 provides for more uniform doping during PVD.

In use, non-planar target 100 is bombarded with ions. The ions are attracted to and impact non-planar target 100, physically knocking loose target copper alloy atoms. The copper alloy atoms knocked loose condense out on wafers placed in the chamber to deposit a film of copper alloy. A higher concentration of alloy atoms results in more alloy atoms that are knocked loose by ions.

Figure 2:
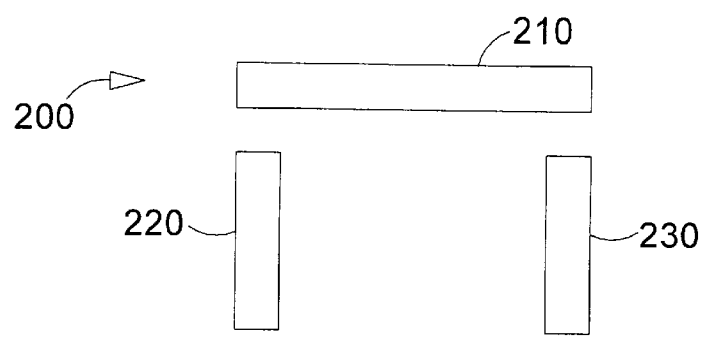
FIG. 2 is a schematic cross-sectional view representation of sections of a non-planar target in accordance with another exemplary embodiment.

FIG. 2 illustrates an unassembled non-planar target 200 including a top portion 210 and side portions 220 and 230. Unassembled non-planar target 200 can be assembled by welding together or diffusion bonding side portions 220 and 230 to top portion 210. Formation of unassembled non-planar target 200 using separate sections or segments can facilitate the alloy doping concentration process.

Figure 3:
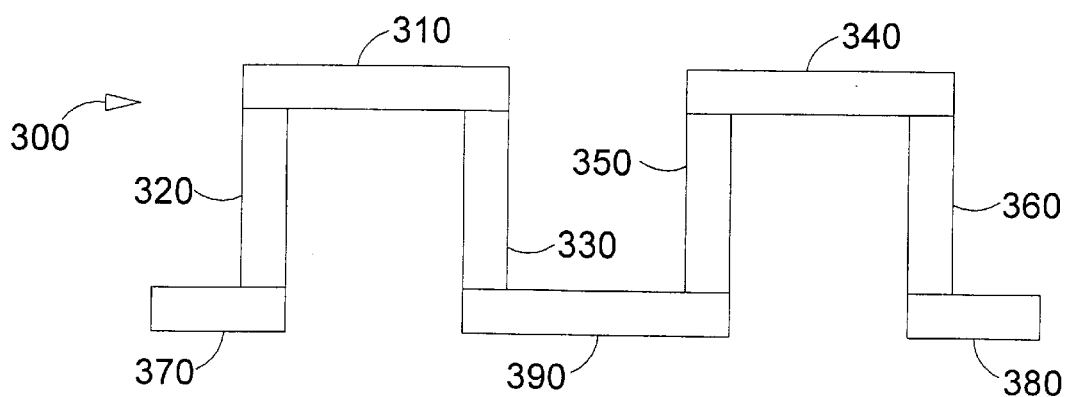
FIG. 3 is a schematic cross-sectional view representation of a non-planar target in accordance with another exemplary embodiment.

FIG. 3 illustrates a non-planar target 300 including top portions 310 and 340, side portions 320 and 330, side portions 350 and 360, footings 370 and 380, and shared footing 390. Ends of side portions 320 and 330 are coupled to ends of top portion 310. Ends of side portions 350 and 360 are coupled to ends of top portion 340. Footings 370 and 380 can be very short in width and are formed by similar way as top portions 310 and 340. However, top portions 310 and 340 can have very slow erosion rate and, thus, do not contribute to the deposition significantly. Shared footing 390 extends between one end of side portion 330 and one end of side portion 350.

For 8" wafers, the target can be bigger in size than the wafers, having a diameter of approximately 12". The aspect ratio of the height of side portions 320, 330, 350, and 360 to the length of top portions 310 and 340 depends on specific chamber design. The aspect ratio can range from ⅓ to 1.5. In one embodiment, top portions 310 and 340 are part of the same piece or section of material. The thickness of target 300 can be between ⅛" to ¾". Target 300 can be bonded to a backing plate, which provides mechanical support.

Top portions 310 and 340 of non-planar target 300 can have alloy concentrations of 0.1 to 2.0 at %. Side portions 320, 330, 350 and 360 can have alloy concentrations of 0.2 to 4.0 at %. Top portions 310 and 340 can have higher concentrations of copper alloy because of the slower erosion or the copper alloy atoms that exists during PVD. In an exemplary embodiment, side portions 320, 330, 350, and 360 erode faster than top portions 310 and 340. However, the erosion characteristic can be reversed if one changes the magnet design to be at the side vs. on the top. In such a case where magnet location is at the side, alloy concentrations at the side portions of the target are higher than the top portions. The magnet design can be optimized for better erosion, within wafer uniformity, particle performance, and ionization ratio for pure Cu. Such a target-making scheme can facilitate the target making and also provides flexibility.

Non-planar target 300 can be formed before or after alloy concentrations are provided. For example, side portions 320, 330, 350 and 360 and top portions 310 and 340 can receive their copper alloy concentrations as separate segments. The alloy pallet can be made by either co-melting Cu and other elements (in which the temperature can be higher than both Cu and the other element melting temperature), or formed by power metallurgy, where lower temperature process can be used, particularly for the element with much higher melting temperature than that of Cu.

After receiving copper alloy concentrations, side portions 320, 330, 350 and 360 and top portions 310 and 340 can be assembled into non-planar target 300 by welding or diffusion bonding. Diffusion bonding is a stronger bond, since it involves the intermixing of surface and subsurface elements of target and the packing plate, which provides the mechanical support. The preferable method is diffusion bond, since the bonding is stronger so can sustain the higher power sputtering typically used in such sputtering system. The process often generates high temperatures.

While the exemplary embodiments illustrated in the FIGURES and described above are presently preferred, it should be understood that these embodiments are offered by way of example only. Other embodiments may include, for example, different target shapes and alloy concentration locations. The invention is not limited to a particular embodiment, but extends to various modifications, combinations, and permutations that nevertheless fall within the scope and spirit of the appended claims.

What is claimed is:

1. A non-planar target configured for use in a plasma vapor deposition (PVD) process in which ions bombard the non-planar target and cause alloy atoms present in the non-planar target to be knocked loose and form an alloy film layer, the target comprising:
   a top planar section having a first alloy concentration; and
   a side annular section having a second alloy concentration, the side annular section having an end coupled to ends of the top planar section, wherein the first alloy concentration is different than the second alloy concentration.

2. The target of claim 1, wherein ends of the top planar section are coupled to the end of the side annular section by welding.

3. The target of claim 1, wherein ends of the top planar section are coupled to the end of the side annular section by diffusion bonding.

4. The target of claim 1, wherein the first alloy concentration is between 0.1 and 2.0 at %.

5. The target of claim 1, wherein the second alloy concentration is between 0.2 and 4.0 at %.

6. The target of claim 1, wherein the alloy of the first and second alloy concentrations is copper.

7. The target of claim 1, further comprising footings coupled to the end of the side annular section distal to the end coupled to ends of the top planar section.

8. A non-planar target for ion bombardment during plasma vapor deposition, the target comprising:
   two top portions having first concentrations of copper alloy atoms; and
   side portions extending from the ends of the two top portions, two of the side portions being coupled together by a shared footing portion at ends distal to the ends coupled to the two top portions, the side portions having second concentrations of copper alloy atoms, wherein the first concentrations are greater than the second concentrations.

9. The target of claim 8, wherein ends of the two top portions are coupled to ends of the side portions by welding.

10. The target of claim 8, wherein ends of the two top portions are coupled to ends of the side portions by diffusion bonding.

11. The target of claim 8, wherein the first concentrations are between 0.1 and 2.0 at %.

12. The target of claim 8, wherein the second alloy concentration are between 0.2 and 4.0 at %.

13. The target of claim 8, wherein the two top portions have a length of ⅓ to 1.5 times the height of side portions.

14. The target of claim 8, wherein the top portions and side portions have a thickness between ⅛" and ¾".

15. A non-planar copper alloy target comprising:
a dome-shaped target having a first concentration of copper alloy atoms at a relatively planar top section of the dome-shaped target and a second concentration of copper alloy atoms at an annular section of the dome-shaped target, wherein the first concentration is greater than the second concentration.

16. The target of claim 15, wherein the first concentration is between 0.2 and 4.0 at %.

17. The target of claim 15, wherein the second concentration is between 0.1 and 2.0 at %.

18. The target of claim 17, wherein the target is configured for use in a chamber having a magnet directed at the annular section of the dome-shaped target.

19. The target of claim 15, wherein the dome-shaped target has a diameter of 12 inches.

20. The target of claim 15, wherein the relatively planar top section is coupled to an end of the annular section by diffusion bonding.

* * * * *